(12) United States Patent
Won

(10) Patent No.: US 8,693,270 B2
(45) Date of Patent: Apr. 8, 2014

(54) SEMICONDUCTOR APPARATUS

(75) Inventor: Hyung Sik Won, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 152 days.

(21) Appl. No.: 13/219,647

(22) Filed: Aug. 27, 2011

(65) Prior Publication Data

US 2012/0275248 A1    Nov. 1, 2012

(30) Foreign Application Priority Data

Apr. 29, 2011  (KR) .................. 10-2011-0040835

(51) Int. Cl.
*G11C 29/00*  (2006.01)
*G11C 7/00*  (2006.01)

(52) U.S. Cl.
USPC ........................ 365/200; 365/225.7

(58) Field of Classification Search
USPC ............... 365/200, 201, 203, 210.1, 225.7, 365/230.03, 230.08
See application file for complete search history.

(56) References Cited

U.S. PATENT DOCUMENTS

| | | | | |
|---|---|---|---|---|
| 4,346,459 A | * | 8/1982 | Sud et al. | 365/200 |
| 4,459,685 A | * | 7/1984 | Sud et al. | 365/200 |
| 4,849,938 A | * | 7/1989 | Furutani et al. | 714/711 |
| 5,126,973 A | * | 6/1992 | Gallia et al. | 365/200 |
| 5,268,866 A | * | 12/1993 | Feng et al. | 365/200 |
| 5,293,348 A | * | 3/1994 | Abe | 365/230.03 |
| 6,172,921 B1 | * | 1/2001 | Park et al. | 365/200 |
| 6,757,852 B1 | * | 6/2004 | Ghassemi et al. | 714/711 |

FOREIGN PATENT DOCUMENTS

KR    1020090078628 A    7/2009

* cited by examiner

*Primary Examiner* — Son Dinh
*Assistant Examiner* — Uyen B Tran
(74) *Attorney, Agent, or Firm* — William Park & Associates Patent Ltd.

(57) ABSTRACT

A semiconductor apparatus includes a memory block configured to have a normal cell array and a redundancy cell array; a column address buffer configured to compare a plurality of input column addresses with a fail column address signal stored in a fuse array, and generate a column enable signal or a fail column enable signal; a column decoder configured to decode the column enable signal, and output a column selection signal to the normal cell array; and a column redundancy controller configured to generate a redundancy control signal in response to the fail column enable signal, generate a redundancy enable signal so as to reuse a redundancy bit line which has been substituted before according to the generated redundancy control signal, and output the generated redundancy enable signal to the redundancy cell array.

7 Claims, 5 Drawing Sheets

US 8,693,270 B2

SEMICONDUCTOR APPARATUS

CROSS-REFERENCES TO RELATED APPLICATION

The present application claims priority under 35 U.S.C. §119(a) to Korean application number 10-2011-0040835, filed on Apr. 29, 2011, in the Korean Intellectual Property Office, which is incorporated herein by reference in its entirety as set forth in full.

BACKGROUND

1. Technical Field

The present invention relates generally to a semiconductor integrated circuit, and more particularly, to a semiconductor apparatus including a redundancy circuit.

2. Related Art

In general, if a semiconductor apparatus has a defective memory cell, the semiconductor apparatus may replace a defective memory cell with an available redundant memory cell.

After a wafer manufacturing process for the semiconductor apparatus is completed, the defective memory cell may be detected by a test operation, and replacement of the defective memory cell may be perform by cutting a fuse.

According to a known art, when a redundancy circuit for cutting the fuse is employed in a semiconductor apparatus, positional information, e.g., a fuse-cut row or column address of a previous defective memory cell is stored to replace the defective memory cell with a redundancy memory cell.

Recently, various electronic devices are being developed to meet requirements for miniaturization, low power consumption, and a low price. Accordingly, semiconductor apparatuses are also being developed toward mass storage, high speed, low power, and new additional functions, and efforts to highly integrate the semiconductor devices continue.

However, if a large number of fuses are required, circuit configuration and wiring may be complicated.

Also, if the number of fuses is reduced to increase the number of die per wafer, the repair efficiency may decrease.

SUMMARY

A semiconductor apparatus suitable for high integration by is improving the area of a redundancy circuit and increasing the repair efficiency is described herein.

In an embodiment of the present invention, a semiconductor apparatus includes: a memory block configured to have a normal cell array and a redundancy cell array; a column address buffer configured to compare a plurality of input column addresses with a fail column address signal pre-stored in a fuse array, and thus to generate a column enable signal or a fail column enable signal; a column decoder configured to decode the column enable signal, and thus to generate and output a column selection signal to the normal cell array; and a column redundancy controller configured to generate a redundancy control signal in response to the fail column enable signal, to generate a redundancy enable signal so as to reuse a redundancy bit line which has been substituted before according to the generated redundancy control signal, and to output the generated redundancy enable signal to the redundancy cell array.

In an embodiment of the present invention, a semiconductor apparatus includes a redundancy circuit, wherein the redundancy circuit includes a redundancy controller configured to allow one redundancy bit line to be reused according to a redundancy control signal when two or more bit fails occur in one normal array.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 1:
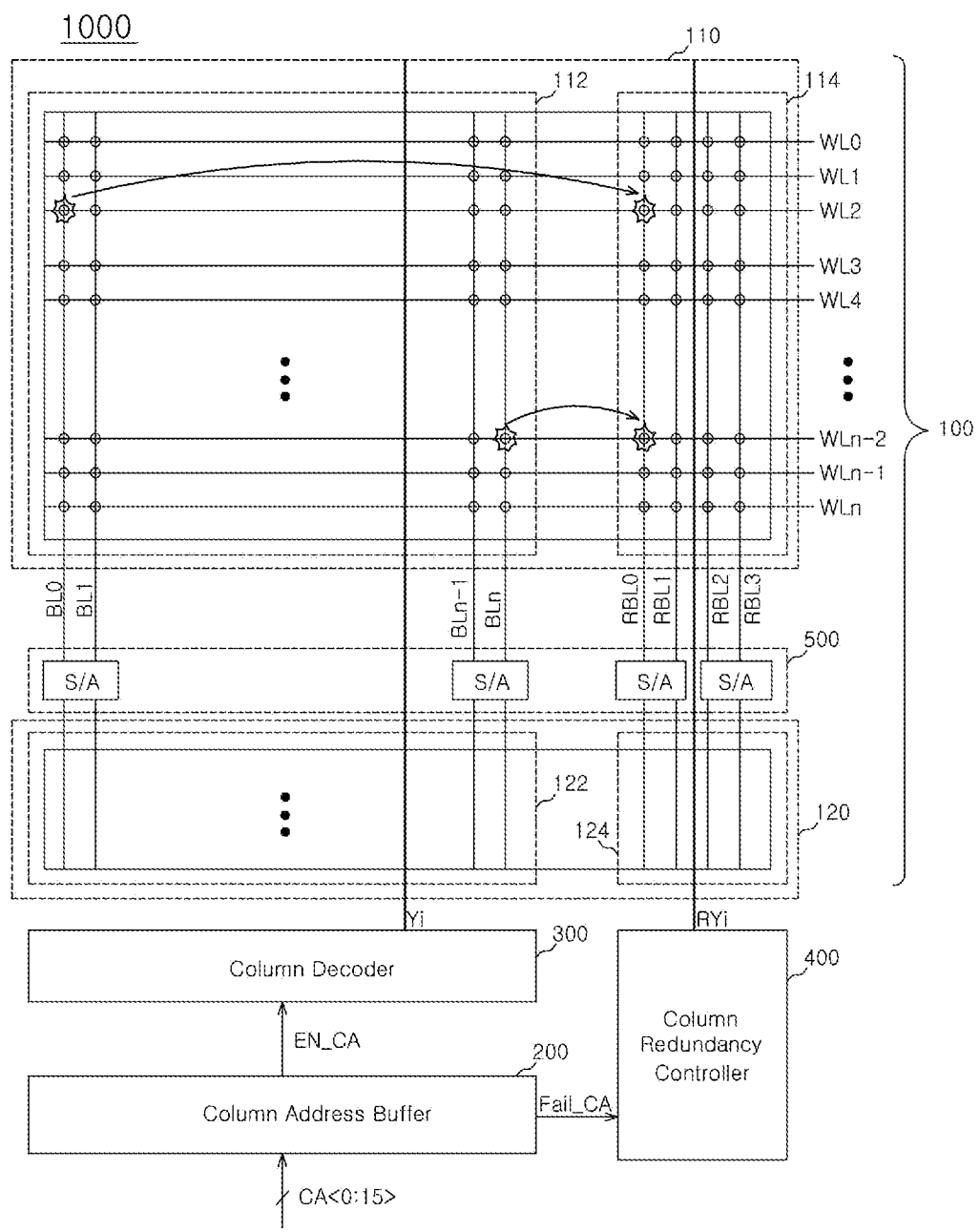
FIG. 1 is a block view of an exemplary semiconductor apparatus according to an embodiment.
Figure 2:
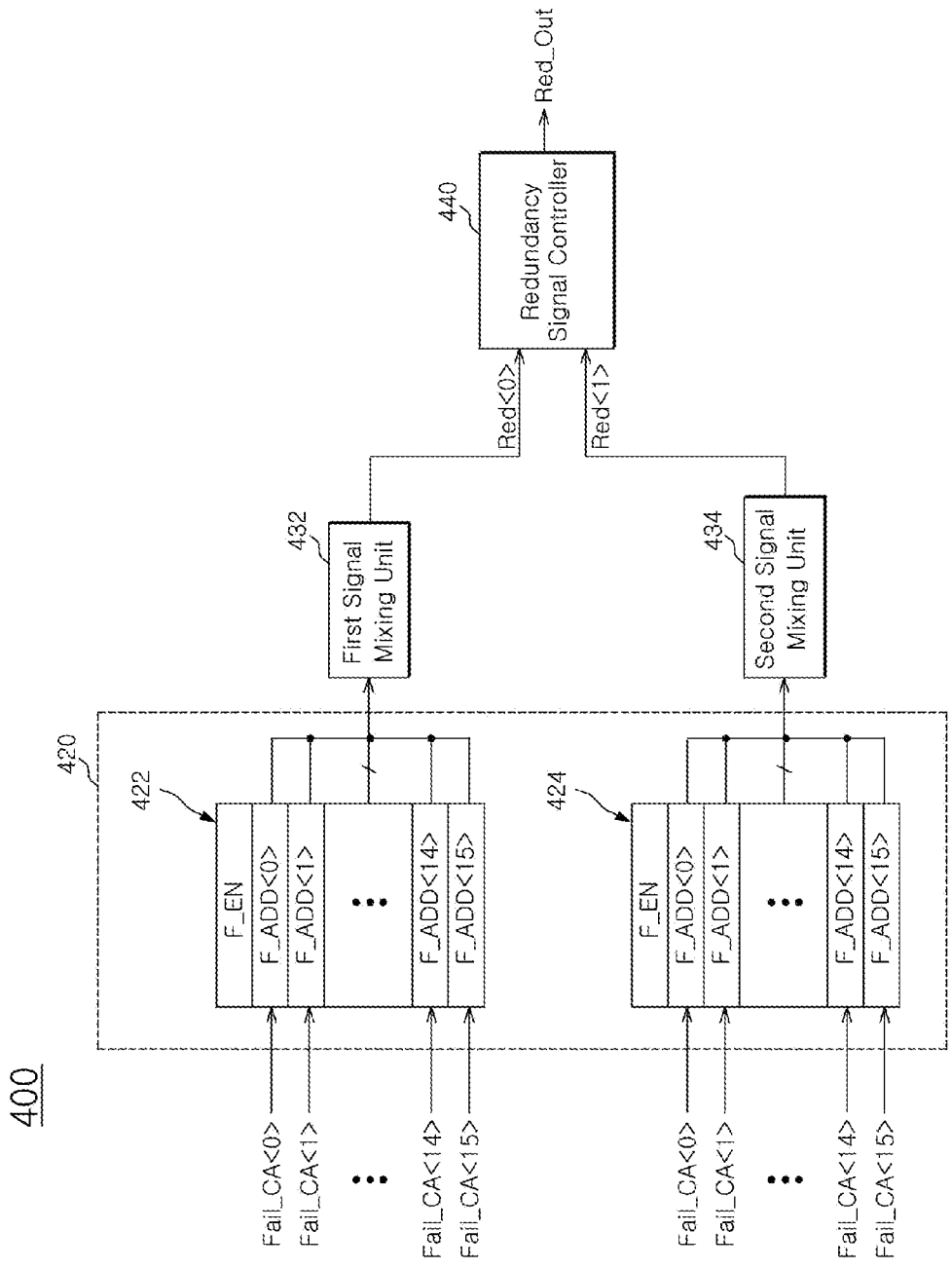
FIG. 2 is a schematic block view of an exemplary column redundancy controller capable of being implemented in the circuit of FIG. 1.

FIG. 1 is a block view of an exemplary semiconductor apparatus according to an embodiment, and FIG. 2 is a schematic block view of an exemplary column redundancy controller capable of being implemented in the circuit of FIG. 1.

Referring to FIG. 1, a semiconductor apparatus 1000 according to an embodiment includes a memory bank 100, a column address buffer 200, a column decoder 300, and a column redundancy controller 400.

The memory bank 100 may include a plurality of bit lines BL0, BL1, ..., and BLn and a plurality of word lines WL0 to WLn, which cross, and also include a first memory block 110 and a second memory block 120, as shown in FIG. 1.

Here, according to an embodiment, the memory bank 100 may be a quarter bank which is a ¼ of a memory bank.

In addition, in an embodiment, for convenience of description, it is assumed that the memory bank 100 includes two memory blocks, i.e. the first memory block 110 and the second memory block 120.

However, the memory bank 100 may include 16 memory blocks, which are distinguished from each other by row addresses.

According to an embodiment of the present invention, the first memory block 110 includes a first normal array 112 and a first redundancy array 114. Here, the first normal array 112 receives a column selection signal (not shown) and allows a bit line corresponding to the received column selection signal to be selected, and the first redundancy array 114 receives a redundancy column selection signal (not shown) from the column redundancy controller 400 and allows a redundancy bit line corresponding to the received redundancy column selection signal to be selected.

Also, similarly to the first memory block 110, the second memory block 120 may include a second normal array 122 and a second redundancy array 124. Here, the second normal array 122 receives a column selection signal (not shown) provided from the a is column decoder 300 and allows a bit line corresponding to the received column selection signal to be selected, and the second redundancy array 124 receives a redundancy column selection signal (not shown) from the column redundancy controller 400 and allows a redundancy bit line corresponding to the received redundancy column selection signal to be selected.

In addition, according to an embodiment of the present invention, the semiconductor apparatus 1000 further includes a plurality of bit line sense amplifiers 500, which are arranged between the first memory block 110 and the second memory block 120 and are electrically connected to the plurality of bit lines BL0, BL1, ... , and BLn arranged in the first memory block 110 and second memory block 120.

In this case, as illustrated in the drawing, the bit line sense amplifiers 500 according to an embodiment of the present invention may be formed as folded bit line sense amplifiers, or may be formed as open bit line sense amplifiers.

The column address buffer 200 is coupled to the column decoder 300 and the column redundancy controller 400.

The column address buffer 200 receives and compares a plurality of column address signals CA<0:15> with a fail column address (not shown) stored in a fuse array (not shown).

The column address buffer 200 may output a column enable signal En_CA or a fail column address signal Fail_CA depending on a result of the comparison.

According to an example, when input column address signals CA<0:15> do not coincide with the fail address stored in the fuse array, the column address buffer 200 may output the column enable signal En_CA corresponding thereto to the column decoder 300. In contrast, when the input column address signals CA<0:15> coincide with the fail address signal, the column address buffer 200 may output the fail column address signal Fail_CA corresponding thereto to the column redundancy controller 400.

The column decoder 300 may decode the column enable signal En_CA inputted from the column address buffer 200, and output a column selection signal Yi to the normal arrays 112 and 122.

The normal arrays 112 and 122 receive the column selection signal Yi from the column decoder 300, and activate a corresponding bit line.

The column redundancy controller 400 receives the fail column address signal Fail_CA from the column address buffer 200, and generates a redundancy enable signal RYi (hereinafter, referred to as "Read_out") in accordance with the received fail column address signal Fail_CA, thereby activating a corresponding redundancy bit line.

According to an example, the column redundancy controller 400 determines if the first normal array 112 and second normal array 122 have failed, according to the status of the fuses, and generate a redundancy control signal.

In addition, the column redundancy controller 400 may generate a redundancy enable signal according to the redundancy is control signal and first and second redundancy signals (Red<0> and Red<1>, respectively, in FIG. 2) outputted from a plurality of fuse sets 422 and 424 (see FIG. 2).

According to an embodiment of the present invention, the column redundancy controller 400 may selectively activate a desired redundancy enable signal in response to the redundancy control signal. Accordingly, if two or more bit fails of which addresses are different from each other occur in the first normal array 112, as shown in FIG. 1, the bit fails can be substituted by one redundancy bit line RBL<0> within the first redundancy array 114 on the basis of a redundancy control signal.

As described above, the semiconductor apparatus 1000 according to an embodiment of the present invention can use a used redundancy bit line at least once more, so that it is possible to reduce the area of the redundancy arrays 114 and 124, and thus to reduce the total area of the semiconductor apparatus 1000.

The column redundancy controller 400 according to an embodiment of the present invention may include a fuse set group 420 and a redundancy signal controller 440, as shown in FIG. 2.

The fuse set group 420 may include a first fuse set 422 corresponding to the first memory block 110 of FIG. 1, and a second fuse set 424 corresponding to the second memory block 120 of FIG. 2.

Here, as shown in FIG. 2, the first fuse set 422 may include an enable fuse F_EN, and a plurality of address comparison fuses F_ADD<0:15> to which a plurality of fail column addresses Fail_CA<0:15> are assigned, respectively. Here, the plurality of fail column addresses Fail_CA<0:15> are inputted from the column address buffer 200 (see FIG. 1).

The first fuse set 422 may generate a first redundancy signal Red<0> on the basis of the plurality of fail column addresses Fail_CA<0:15> inputted to the first fuse set 422. In this case, the first redundancy signal Red<0> corresponds to a signal which is obtained by mixing all the output signals outputted from the first fuse set 422 in a first signal mixing unit 432.

Also, similarly to the first fuse set 422, the second fuse set 424 may include an enable fuse F_EN, and a plurality of address comparison fuses F_ADD<0:15> to which a plurality of fail column addresses Fail_CA<0:15> are assigned, respectively. Here, the plurality of fail column addresses Fail_CA<0:15> are inputted from the column address buffer 200 (see FIG. 1).

The second fuse set 424 may generate a second redundancy signal Red<1> on the basis of the plurality of fail column addresses Fail_CA<0:15> inputted to the second fuse set 424. In this case, the second redundancy signal Red<1> corresponds to a signal which is obtained by mixing all the output signals outputted from the second fuse set 424 in a second signal mixing unit 434.

According to an embodiment of the present invention, the first fuse set 422 and the second fuse set 424 are configured to have the same enable fuse F_EN and address comparison fuses F_ADD<0:15>. The enable fuse F_EN and address comparison fuses F_ADD<0:15> will be described in detail with reference to FIGS. 3 and 4 later.

As shown in FIG. 2, the redundancy signal controller 440 receives a first redundancy signal Red<0> and a second redundancy signal Red<1> which are outputted from the first signal mixing unit 432 and second signal mixing unit 434.

In addition, the redundancy signal controller 440 may generate a redundancy enable signal Red_out in response to the first and second redundancy signals Red<0> and Red<1>, and may activate a corresponding redundancy bit line.

As described above, although two bit fails occur within the first normal array 112, the redundancy signal controller 440 can substitute the bit fails by one redundancy bit line RBL<0> within the first redundancy array 114 on the basis of a redundancy control signal, as shown in FIG. 1.

As described above, since the semiconductor apparatus 1000 according to an embodiment of the present invention can use a used redundancy bit line at least once more, it is possible to reduce the area of the redundancy arrays 114 and 124, and thus to reduce the total area of the semiconductor apparatus 1000.

Figure 3:
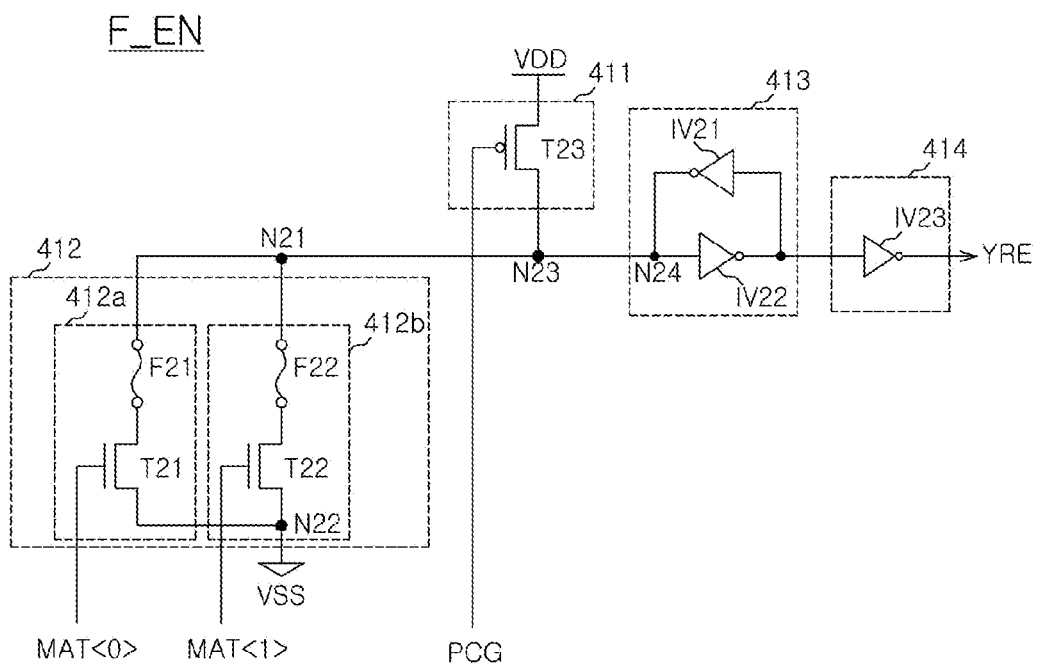
FIG. 3 is a schematic circuit of an exemplary enable fuse capable of being implemented in the first fuse set of FIG. 2.

FIG. 3 is a schematic circuit of an exemplary enable fuse capable of being implemented in the first fuse set of FIG. 2. Here, according to an embodiment of the present invention, the enable fuse of the second fuse set may have the same configuration as the enable fuse of the first fuse set, so that the following description will is be given on only an enable fuse of the first fuse set.

As shown in FIG. 3, an enable fuse F_EN includes a first input unit 411, a first cutting sense unit 412, and a first latch unit 413.

The first input unit 411 may be activated in response to a pre-charge signal PCG, and may include a PMOS transistor T23.

More specifically, when receiving a pre-charge signal PCG of a low level as a gate signal, the first input unit 411 is activated while the electric potential of a 23rd node N23 is raised to a high level.

In contrast, when receiving a pre-charge signal PCG of a high level as a gate signal, the first input unit 411 is inactivated while the electric potential of the 23rd node N23 is lowered to a low level. The first cutting sense unit 412 may include a first sense unit 412a and a second sense unit 412b being assigned to normal arrays 112 and 122 of FIG. 1. Here, the sense units such as the first sense unit 412a and the second sense unit 412b, and the normal arrays 112 and 122 may be in one-to-one correspondence.

The first sense unit 412a may include a fuse F21 and a switching unit T21. In this case, an end of the fuse F21 is coupled to a 21st node N21, and the other end of the fuse F21 is coupled to the switching unit T21.

In addition, the switching unit T21 of the first sense unit 412a may include an NMOS transistor, and receive a first memory block enable signal MAT<0> to activate the first memory block 110 of FIG. 1 as a gate signal. Also, the drain of the switching unit T21 is may be coupled to the other end of the fuse F21, and the source of the switching unit T21 may be coupled to a 22nd node N22.

Similarly to the first sense unit 412a, the second sense unit 412b may include a fuse F22 and a switching unit T22. In this case, an end of the fuse F22 is coupled to the 21st node N21, and the other end of the fuse F22 is coupled to the switching unit T22.

In addition, the switching unit T22 of the second sense unit 412b may include an NMOS transistor, and receive a second memory block enable signal MAT<1> to activate the second memory block 120 as a gate signal.

Also, the drain of the switching unit T22 may be coupled to the other end of the fuse F22, and the source of the switching unit T22 may be coupled to a ground voltage terminal VSS.

The first latch unit 413 may include a 22nd inverter IV22 configured to receive the electric potential value of a 24th node N24, and a 21st inverter IV21 coupled in a latch configuration with the 22nd inverter IV22.

The first latch unit 413 latches a value according to the electrical potential value of the 23rd node N23, which varies by the first input unit 411 and the first cutting sense unit 412.

According to an embodiment of the present invention, the enable fuse F_EN may further include a first reverse unit 414, which reverses a value outputted from the first latch unit 413 and generates an enable signal YRE.

Hereinafter, the operation of the enable fuse F_EN according is to an embodiment of the present invention will be described. When receiving a pre-charge signal PCG of a low level as a gate signal, the first input unit 411 is turned on, and the electric potential of the 23rd node N23 is raised to a high level. In contrast, when receiving a pre-charge signal PCG of a high level as a gate signal, the first input unit 411 is inactivated, and thus the electric potential of the 23rd node N23 is lowered to a low level.

The first sense unit 412a and second sense unit 412b of the first cutting sense unit 412 may be activated in response to the levels of the first memory block enable signal MAT<0> and second memory block enable signal MAT<1>, respectively.

Here, the fuses F21 and F22 of the first and second sense units 412a and 412b, respectively, are cut in a normal mode. In this case, although the memory block enable signals MAT<0> and MAT<1> of a high level are inputted to the switching units T21 and T22 of the first and second sense units 412a and 412b, respectively, it does not exert an effect upon a change in the electric potential of the 21st node N21 because the fuses F21 and F22 have been cut. Accordingly, the level of the fuse enable signal YRE of the enable fuse F_EN can be determined by the first input unit 411.

In contrast, in a redundancy mode, the fuses F21 and F22 of the first and second sense units 412a and 412b, respectively, have not been cut. Therefore, when the first sense unit 412a and second sense unit 412b receive one or more memory block enable signals MAT<0> and MAT<1> having a high level through the plurality of switching units T21 and T22, respectively, the electric potential of the 21st node N21 is lowered to a low level.

In this case, although the electric potential of the 23rd node N23 has been at a high level by activation of the first input unit 411, the electric potential of the 23rd node N23 is transitioned to a low level regardless of activation or inactivation of the first input unit 411 when the first cutting sense unit 412 is activated.

In contrast, in a redundancy mode, when the first sense unit 412a and second sense unit 412b receive one or more memory block enable signals MAT<0> and MAT<1> having a low level through the plurality of switching units T21 and T22, respectively, the switching units T21 and T22 are not activated, and thus the electric potential of the 21st node N21 is raised to a high level. Accordingly, the level of the fuse enable signal YRE of the enable fuse F_EN may be determined by the first input unit 411.

Figure 4:
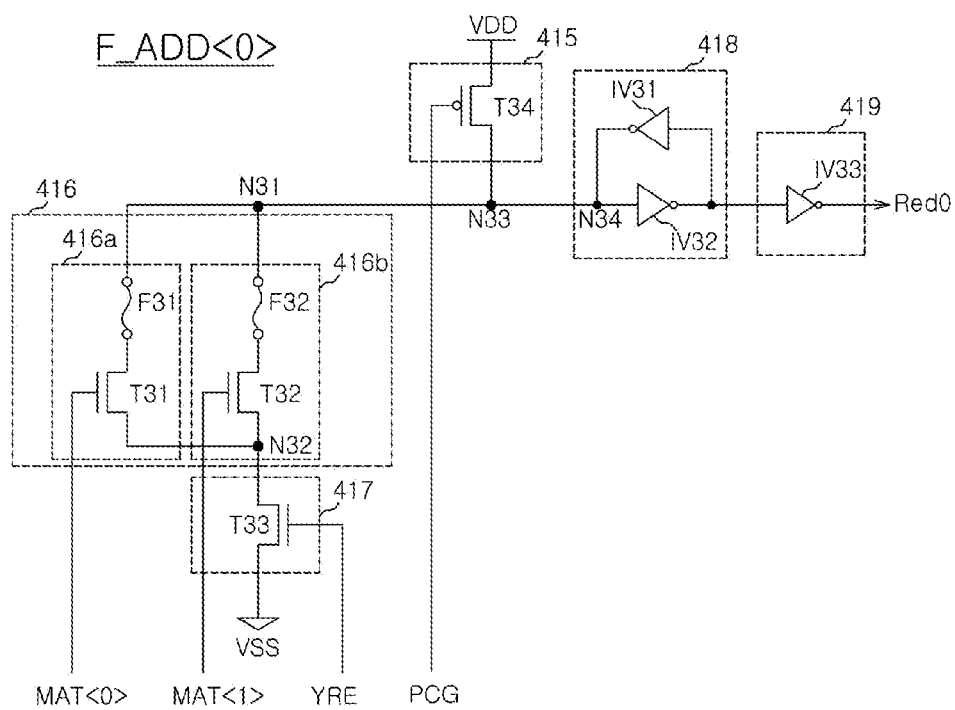
FIG. 4 is a schematic circuit of an exemplary first address comparison fuse capable of being implemented in the address comparison fuses of the first fuse set of FIG. 2.

FIG. 4 is a schematic circuit of an exemplary first address comparison fuse capable of being implemented in the address comparison fuses of the first fuse set of FIG. 2. Here, since all the address comparison fuses according to an embodiment of the present invention are formed to have the same configuration, the following description will be given only on the first address comparison fuse of the first fuse set, while description on the other address comparison fuses will be omitted.

As shown in FIG. 4, according to an embodiment of the present invention, the address comparison fuse F_ADD<0> includes a is second input unit 415, a second cutting sense unit 416, a fuse blowing check unit 417, and a second latch unit 418.

The second input unit 415 may be activated in response to a pre-charge signal PCG, and may include a PMOS transistor T34. More specifically, when receiving a pre-charge signal PCG of a low level as a gate signal, the second input unit 415 is activated while the electric potential of a 33rd node N33 is raised to a high level.

In contrast, when receiving a pre-charge signal PCG of a high level as a gate signal, the second input unit 415 is inactivated while the electric potential of the 33rd node N33 is lowered to a low level.

The second cutting sense unit 416 may include a third sense unit 416a and a fourth sense unit 416b being assigned to the normal arrays 112 and 122 of FIG. 1. Here, the sense units such as the third sense unit 416a and the fourth sense unit 416b, and the normal arrays 112 and 122 may be in one-to-one correspondence.

The third sense unit 416a can be configured with a fuse F31 and a switching unit T31. In this case, an end of the fuse F31 is coupled to a 31st node N31, and the other end of the fuse F31 is coupled to the switching unit T31.

In addition, the switching unit T31 of the third sense unit 416a may include an NMOS transistor, and receive a first memory block enable signal MAT<0> to activate the first memory block 110 as a gate signal. Also, the drain of the switching unit T31 may be coupled to the other end of the fuse F31, and the source of the switching unit T31 may be coupled to a 32nd node N32.

Similarly to the third sense unit 416a, the fourth sense unit 416b may include a fuse F32 and a switching unit T32. In this case, an end of the fuse F32 is coupled to the 31st node N31, and the other end of the fuse F32 is coupled to the switching unit T32.

In addition, the switching unit T32 of the fourth sense unit 416b may include an NMOS transistor, and receive a second memory block enable signal MAT<1> to activate the second memory block 120 as a gate signal.

Also, the drain of the switching unit T32 may be coupled to the other end of the fuse F32, and the source of the switching unit T32 may be electrically connected to the fuse blowing check unit 417.

The fuse blowing check unit 417 can control the electric potential of the 32nd node N32 in response to a fuse enable signal PCG provided from the enable fuse F_EN of FIG. 2.

The fuse blowing check unit 417 may include an NMOS transistor T33.

More specifically, a fuse enable signal YRE is inputted to the gate of the fuse blowing check unit 417 as an input signal, the drain of the fuse blowing check unit 417 is electrically connected to the second cutting sense unit 416 through the 32nd node N32, and the source of the fuse blowing check unit 417 may be coupled with the ground voltage terminal VSS.

The second latch unit 418 may include a 32nd inverter IV32 configured to receive the electric potential value of a 34th node N34, and a 31st inverter IV31 coupled in a latch configuration with the 32nd inverter IV32.

The second latch unit 418 latches a value according to the electrical potential value of the 33rd node N33 which varies by the second input unit 415 and the second cutting sense unit 416.

According to an embodiment of the present invention, the address comparison fuse F_ADD<0> may further include a second reverse unit 419, which reverses a value outputted from the second latch unit 418 and generates a first redundancy control signal Red <0>.

Hereinafter, the operation of the address comparison fuse F_ADD<0> according to an embodiment of the present invention will be described. When receiving a pre-charge signal PCG of a low level as a gate signal, the second input unit 415 is turned on, and the electric potential of the 33rd node N33 is raised to a high level.

In contrast, when receiving a pre-charge signal PCG of a high level as a gate signal, the second input unit 415 is inactivated, and thus the electric potential of the 33rd node N33 is lowered to a low level.

The third sense unit 416a and fourth sense unit 416b of the second cutting sense unit 416 are activated in response to the levels of the first memory block enable signal MAT<0> and second memory block enable signal MAT<1>, respectively.

Especially, the fuses F31 and F32 of the second cutting sense unit 416 have been cut in a normal mode. In this case, although the first memory block enable signal MAT<0> and second memory block enable signal MAT<1> having a high level are inputted to the switching units T31 and T32, respectively, it does not exert an effect upon the 31st node N31.

Accordingly, the level of the redundancy signal Red<0> of the address comparison fuse F_ADD<0> is determined by the second input unit 415.

In contrast, in a redundancy mode, the fuses F31 and F32 of the second cutting sense units 416 have not been cut. Therefore, when one or more memory block enable signals MAT<0> and MAT<1> having a high level are inputted to the plurality of switching units T31 and T32, respectively, in the second cutting sense unit 416, the electric potential of the 32nd node N32 is raised to a high level. In this case, since the fuse blowing check unit 417 prevents the electric potential of the 32nd node N32 from being discharged to the ground voltage terminal VSS, the electric potential of the 31st node N31 also is raised to a high level.

In this case, the electric potential of the 33rd node N33 varies depending on the fuse blowing check unit 417 regardless of whether or not the second input unit 415 is activated, so that the address comparison fuse F_ADD<0> outputs the first redundancy signal Red<0> as an output signal.

In addition, in a redundancy mode, when memory block enable signals MAT<0> and MAT<1> having a low level are inputted to the plurality of switching units T31 and T32, respectively, in the second cutting sense unit 416, the electric potential of the 31st node N31 is lowered to a low level. Accordingly, the address comparison fuse F_ADD<0> outputs a value stored in the second latch unit 418, as an output signal thereof.

Figure 5:
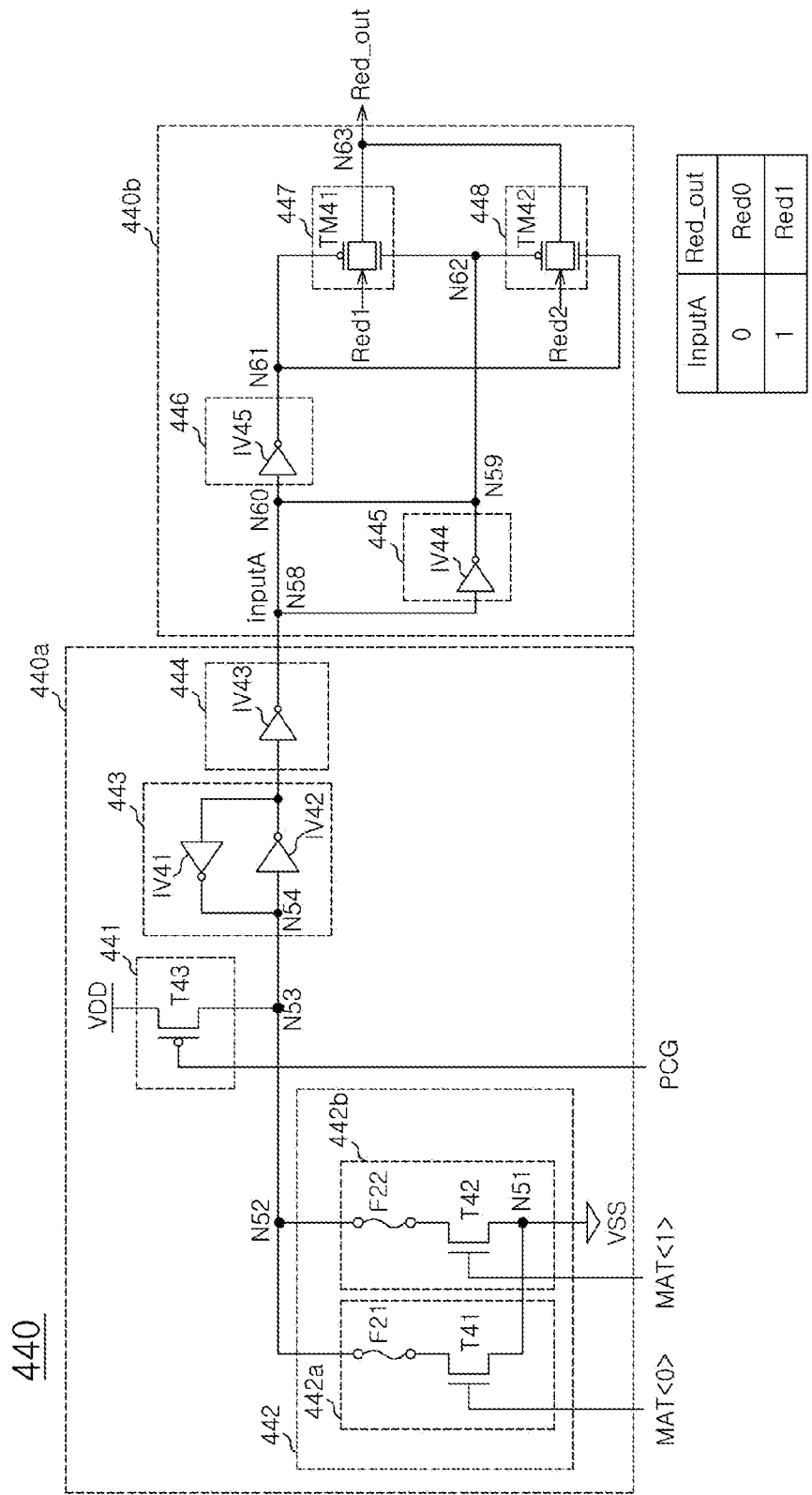
FIG. 5 is a schematic circuit of an exemplary redundancy signal controller capable of being implemented in the circuit of FIG. 2.

FIG. 5 is a schematic circuit of an exemplary redundancy signal controller capable of being implemented in the circuit of FIG. 2.

As shown in FIG. 5, according to an embodiment of the present invention, the redundancy signal controller 440 includes a redundancy control signal generation unit 440a and a redundancy signal selection unit 440b.

The redundancy control signal generation unit 440a may generate a redundancy control signal "input A" to select a redundancy signal Red_out.

As shown in FIG. 5, the redundancy control signal generation unit 440a may include a third input unit 441, a third cutting sense unit 442, and a third latch unit 443.

In this case, the configuration of the redundancy control signal generation unit 440a is the same as that of the enable fuse, so a detailed description thereof will be omitted.

The redundancy signal selection unit 440b includes a first selector 447 and a second selector 448.

The first selector 447 may include a transmission gate TM41, and may output a second redundancy signal Red<1> to a corresponding redundancy array in response to an output signal of the redundancy control signal generation unit 440a.

More specifically, the first selector 447 may be activated by the value of a 61st node N61 formed at the output end of a 45th inverter IV45 and the value of a 59th node N59 formed at the output end of a 44th inverter IV44. That is to say, the first selector 447 may be activated when the output signal "input A" outputted from the redundancy control signal generation unit 440a to the first selector 447 is at a low level.

In contrast, when the output signal "input A" inputted from the redundancy control signal generation unit 440a to first selector 447 is at a high level, the first selector 447 is not operated.

The second selector 448 may include a transmission gate TM42, and may output a first redundancy signal Red<0> to a corresponding redundancy array in response to an output signal "input A" outputted from the redundancy control signal generation unit 440a.

More specifically, the second selector 448 may be activated by the value of a 59th node N59 formed at the output end of a 44th inverter 1V44 and the value of a 61st node N61 formed at the output end of a 45th inverter 1V45. That is to say, the second selector 448 may be activated when the output signal "input A" outputted from the redundancy control signal generation unit 440a to the second selector 448 is at a high level.

In contrast, when the output signal "input A" inputted from the redundancy control signal generation unit 440a to second selector 448 is at a low level, the second selector 448 is not operated.

As described above, according to an embodiment of the is present invention, the redundancy signal controller 440 can generate a redundancy control signal "input A", and selectively activate any one of the plurality of redundancy signals Red<0> and Red<1>, which are inputted from a plurality of fuse sets, in response to the generated redundancy control signal "input A".

Accordingly, in the semiconductor apparatus 1000 according to an embodiment of the present invention, if two or more bit fails of which addresses are different from each other occur in the normal array, the bit fails can be substituted by one redundancy bit line. Thus, according to an embodiment of the present invention, it is possible to reduce the area of the redundancy array in the semiconductor apparatus.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A semiconductor apparatus comprising:
a memory block configured to have a normal cell array and a redundancy cell array;
a column address buffer configured to compare a plurality of input column addresses with a fail column address signal pre-stored in a fuse array, and thus to generate a column enable signal or a fail column enable signal;
a column decoder configured to decode the column enable signal, and thus to generate and output a column selection signal to the normal cell array; and
a column redundancy controller configured to generate a redundancy control signal in response to the fail column enable signal, to allow one redundancy bit line to be substituted according to the redundancy control signal when two or more bit fails occur in one normal array,
wherein the column redundancy controller comprises:
a fuse set group configured to comprise a fuse set corresponding to the memory cell array, and to generate a redundancy signal having information on a redundancy bit line to be substituted according to the fail column address; and
a redundancy signal controller configured to generate the redundancy enable signal, which activates the redundancy bit line to be substituted, in response to the redundancy signal received from the fuse set group, and to provide the generated redundancy enable signal to the redundancy cell array
wherein the fuse set group comprises:
one enable fuse configured to generate a fuse enable signal; and
a plurality of address comparison fuses coupled to the fail column address in one-to-one correspondence, and configured to generate the redundancy signal in response to the fuse enable signal of the one enable fuse, and wherein the one enable fuse comprises:
a first input unit configured to be activated in response to a pre-charge signal;
a first fuse blowing check unit configured to receive a memory block enable signal which activates the normal cell array as a gate signal; and
a first latch unit configured to generate a fuse enable signal according to whether the first input unit and the first fuse blowing check unit are activated, and to latch and output the generated fuse enable signal.

2. The semiconductor apparatus according to claim 1, wherein each of the plurality of address comparison fuses comprises:
a second input unit configured to be activated in response to a pre-charge signal;
a second fuse blowing check unit configured to receive a memory block enable signal which activates the normal cell array as a gate signal;
a fuse enable sense unit configured to control an electric potential of the second fuse blowing check unit in response to the fuse enable signal inputted from the enable fuse; and
a second latch unit configured to generate a fuse enable signal according to whether the second input unit and the second fuse blowing check unit are activated, and to latch and output the generated fuse enable signal.

3. The semiconductor apparatus according to claim 1, wherein the redundancy signal controller comprises:
a redundancy control signal generation unit configured to generate a redundancy control signal for determining whether the redundancy bit line which has been substituted before is required to be reused in response to a pre-charge signal and a memory block enable signal; and
a redundancy signal selection unit configured to selectively output the redundancy signal in response to the redundancy control signal, and thus to generate the redundancy enable signal.

4. A semiconductor apparatus comprising a redundancy circuit, wherein the redundancy circuit comprises a redundancy controller configured to allow one redundancy bit line to be substituted according to a redundancy control signal when two or more bit fails occur in one normal array,
wherein the redundancy controller comprises:
a fuse set group configured to comprise a plurality of fuse sets one-to-one corresponding to a plurality of memory blocks, respectively, and to generate a redundancy signal having information on a redundancy bit line to be substituted through each of the plurality of fuse sets; and
a redundancy signal controller configured to generate the redundancy enable signal, which activates the redundancy bit line to be substituted, in response to the redundancy signal received from the fuse set group, and to provide the generated redundancy enable signal to a redundancy cell array
wherein the fuse set group comprises:
one enable fuse configured to generate a fuse enable signal; and
a plurality of address comparison fuses coupled to input fail column addresses in one-to-one correspondence, and configured to generate the redundancy signal in response to the fuse enable signal of the one enable fuse
wherein the one enable fuse comprises:
a first input unit configured to be activated in response to a pre-charge signal;

a first fuse blowing check unit configured to receive a memory block enable signal which activates the normal cell array as a gate signal; and a first latch unit configured to generate a fuse enable signal according to whether the first input unit and the first fuse blowing check unit are activated, and to latch and output the generated fuse enable signal.

5. The semiconductor apparatus according to claim 4, wherein each of the plurality of address comparison fuses comprises:

a second input unit configured to be activated in response to a pre-charge signal;

a second fuse blowing check unit configured to receive a memory block enable signal which activates the normal cell array as a gate signal;

a fuse enable sense unit configured to control an electric potential of the second fuse blowing check unit in response to the fuse enable signal inputted from the enable fuse; and a second latch unit configured to generate a fuse enable signal according to whether the second input unit and the second fuse blowing check unit are activated, and to latch and output the generated fuse enable signal.

6. The semiconductor apparatus according to claim 4, wherein the redundancy signal controller comprises:

a redundancy control signal generation unit configured to generate a redundancy control signal for determining whether the redundancy bit line which has been substituted before is required to be reused in response to a pre-charge signal and a memory block enable signal; and a redundancy signal selection unit configured to selectively output the redundancy signal in response to the redundancy control signal, and thus to generate the redundancy enable signal.

7. The semiconductor apparatus according to claim 6, wherein the redundancy signal selection unit comprises:

a first selector configured to selectively output one of a plurality of redundancy signals which are outputted from the fuse set group, in response to a first level of the redundancy control signal; and a second selector configured to selectively output another of the plurality of redundancy signals which are outputted from the fuse set group, in response to a second level of the redundancy control signal.

* * * * *